United States Patent [19]

Sim et al.

[11] Patent Number: 5,840,614
[45] Date of Patent: Nov. 24, 1998

[54] METHOD OF PRODUCING A SEMICONDUCTOR WAFER USING ULTRAVIOLET SENSITIVE TAPE

[75] Inventors: Sung Min Sim, Suwon-city; Do Yun Hwang, Kwangjin-gu, both of Rep. of Korea

[73] Assignee: Samsung Electronics Co., Ltd., Suwon, Rep. of Korea

[21] Appl. No.: 744,376

[22] Filed: Nov. 7, 1996

[30] Foreign Application Priority Data

Nov. 8, 1995 [KR] Rep. of Korea .................. 9540239

[51] Int. Cl.⁶ .................................................. H01L 21/302
[52] U.S. Cl. .............................. 438/464; 438/33; 438/63; 438/113; 438/114; 438/759; 438/690; 438/691; 438/455; 438/459
[58] Field of Search .................... 438/113, 690, 438/691, 759, 33, 63, 114, 465, 459, 464, 455

[56] References Cited

U.S. PATENT DOCUMENTS 5,238,876  8/1993  Takeuchi .
5,284,803  2/1994  Haisma .
5,332,406  7/1994  Takeuchi .
5,590,787  1/1997  Hodges .

OTHER PUBLICATIONS

CA:122:83257 abstract of JP06177094 Jun. 1994.

WPIDS AN:244003 abstract of JP06188094 Jun. 1996.

CA:114:44495, Abst of JP02187278, Satsuma, "Releasable adhesives for favrication of semiconductor wafers" Jun. 1990.

*Primary Examiner*—Gary Geist
*Assistant Examiner*—Jean F. Vollano
*Attorney, Agent, or Firm*—Jones & Volentine, L.L.P.

[57] ABSTRACT

A process for producing semiconductor devices using ultraviolet sensitive tape including the steps of forming a plurality of chips on a first surface of a semiconductor wafer, adhering an ultraviolet sensitive tape to the first surface of the semiconductor wafer, back lapping a second surface of the wafer, opposite to the first surface, and irradiating the ultraviolet sensitive tape with ultraviolet rays to release the ultraviolet sensitive tape from the wafer.

6 Claims, 5 Drawing Sheets

METHOD OF PRODUCING A SEMICONDUCTOR WAFER USING ULTRAVIOLET SENSITIVE TAPE

BACKGROUND OF THE INVENTION

1. Field of the Invention

The present invention relates generally to a process for producing semiconductor devices, and in particular to a process for producing semiconductor devices which comprises the steps of lapping the back (bottom) surface of a wafer, a front (upper or active) surface of which being adhered with an ultraviolet sensitive tape, and irradiating ultraviolet rays to reduce the adhesiveness of the tape, rendering a removal of the tape from the wafer.

2. Description of the Related Art

In a typical semiconductor wafer manufacturing process, a semiconductor wafer is subjected to successive steps of oxidation, etching, diffusion and ion injection to form desired patterns on its active surface. After completion of the wafer processing, the wafer is subjected to a wafer back lapping process, in which the back surface opposite to the surface on which the patterns are formed is lapped to reduce the thickness of the wafer. This "wafer back lapping process" is distinguished from the so-called "polishing process" in which a side or both sides of the wafer are polished to a high degree in order to eliminate surface imperfections resulting from slicing operations. The polishing process produces a highly flat surface required for fine-line photolithography and improves the parallelism of the two major surfaces of the wafer, which will be subjected to wafer processing steps. The wafer back lapping process is required for the fabrication of thin packages such as TSOP (Thin Small Outline Package) or UTSOP (Ultra Thin Small Outline Package) as well as the usual packages.

FIGS. 1A through 1E are schematic illustrations of successive steps of a conventional process for lapping the back (bottom) surface of a wafer.

With reference now to FIG. 1A, after completion of wafer processing process (not shown), an active surface 2 (that is, where the desired patterns are formed) of a wafer 1 is coated with a photoresist 3 by applying a uniform film of photoresist emulsion on the active surface 2 and then baking the wafer. The photoresist 3 protects the pattern formed on the wafer 1 from being damaged during the removal of a protective tape (described below in greater detail) and during the back lapping process.

In FIG. 1B, a protective vinyl tape 5 is adhered onto the photoresist 3. In FIG. 1C, the wafer is fixed to a stage (not shown) and the reverse side 4 (that is, the side opposite to the side where the photoresist is coated) of the wafer 1 is polished or lapped with a grinder or lap 7 so that the wafer has a thickness W2. The thickness W2 is usually two-thirds (⅔) of the original thickness W1, and is less than one-third (⅓) for thin packages.

In FIG. 1D, after completion of the back lapping process, the vinyl tape 5 and the photoresist 3 are peeled from the wafer 1, followed by a rinsing step with deionized water and a drying step, resulting in a cleansed wafer of a thickness W2 as shown in FIG. 1E.

This conventional back lapping process, however, has many problems. First, a large number of steps and long production times are required, such that the quality of the products may fluctuate undesirably over time.

Second, when the photoresist 3 is not completely removed from the wafer during the rinsing step, the remaining photoresist must be removed by additional repeated work, which could result in damage to metals forming circuit patterns on the wafer (for example, aluminum bonding pads), and consequently causing wire bonding failures. Further, damage to the metal may cause corrosion of the metal, leakage currents, and open failures during demanding reliability tests such as a PCT (Pressure Cooker Test), which is carried out in an autoclave at 100% humidity and a temperature of 121±2° C.

Third, chemical compounds are used to remove the protective vinyl tape 5 and the photoresist 3 in the step shown in FIG. 1D. These compounds, however, are not easily rinsed off the wafer. Thus, there may be residual chemical compounds or vinyl tape debris left on the wafer, causing package failures, such as cracks, when the wafer is packaged and mounted onto a PCB (Printed Circuit Board) and subjected to a reflow process. This is because the residual materials weaken the adhesion force between the chip and an epoxy molding compound and the resulting package cannot endure the stress during the reflow process.

Fourth, wafers are susceptible to breakage during the conventional wafer back lapping process shown in FIG. 2. The process consists of the following steps: processing 10 the wafer, in which desired patterns are formed on a surface of a wafer; coating a photoresist film 11; curing the photoresist film 12; adhering a vinyl tape 13; back lapping the wafer 14; removing the vinyl tape 15; removing the photoresist 16; cleansing the wafer 17; and drying the wafer 18. After completion of the back lapping process, the wafer is transferred 19 to an EDS (Electrical Die Sorting) test station 20 in which electrical characteristics of individual chips (dice) are tested and the good and bad dices are identified. Then, the wafer is scribed 21 and divided into dice. Since the EDS test of the wafer is carried out after the back lapping process, the wafer has a thickness of one-third or one-half of original thickness and must therefore be carefully handled during the test and its transfer. Moreover, the recent trend towards large 12 inch diameter wafers makes the handling of the wafers more difficult. Accordingly, wafer breakage during the test is highly likely.

SUMMARY OF THE INVENTION

Thus, an object of the invention is to provide an improved process for producing semiconductor devices which comprises a novel wafer back lapping process, thereby avoiding one or more of the problems described above.

This object can be accomplished by adhering an ultraviolet sensitive tape to the surface of the wafer where predetermined circuit patterns are formed, instead of applying a photoresist and a protective vinyl tape, before the wafer is subjected to the wafer back lapping process. The ultraviolet sensitive tape is an adhesive-type tape that loses its adhesiveness when irradiated by ultraviolet rays. By adhering the ultraviolet sensitive tape to the wafer, the process steps of applying and removing the photoresist and protective vinyl tape on the wafer can be avoided. Consequently the problems associated with the applications of the photoresist and vinyl tape, and the use of chemical compounds for removing them from the wafer can be avoided.

The invention thus provides a process for producing semiconductor devices, the process comprising the steps of: forming a plurality of chips having predetermined circuit patterns on a first surface of a semiconductor wafer; adhering an ultraviolet sensitive tape to the first surface of the semiconductor wafer; lapping a second surface of the wafer, opposite to the first surface where the circuit patterns are formed; and irradiating the ultraviolet sensitive tape with ultraviolet rays to release the ultraviolet sensitive tape from the wafer.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

The present invention will now be described in more detail with reference to the accompanying drawings.

Figure 3A:
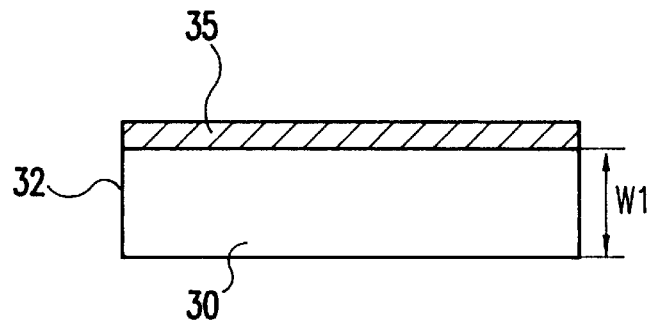
FIGS. 3A through 3C are schematic illustrations of successive steps of a process for lapping the back of a wafer according to the present invention.
Figure 3B:
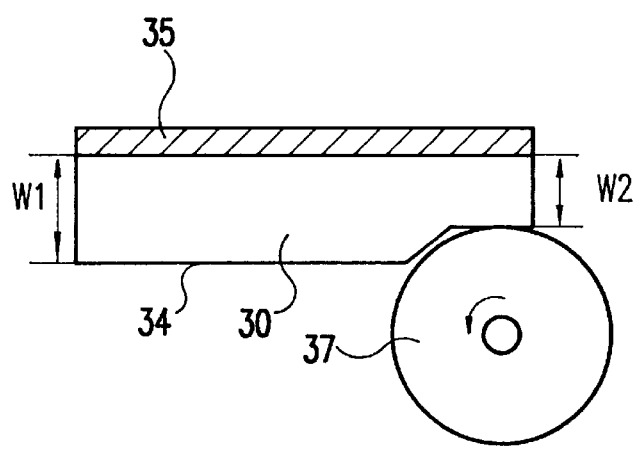
Figure 3D:
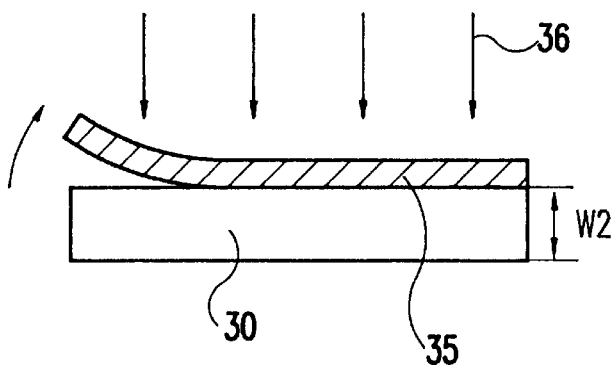

FIGS. 3A through 3C are schematic illustrations of successive steps of the process for lapping the back of a wafer according to the present invention. With reference to FIG. 3A, an ultraviolet sensitive tape 35 is adhered to an active surface 32 of a wafer 30, where desired patterns are formed, the wafer having a thickness of W1. In FIG. 3B, the wafer 30 with the ultraviolet sensitive tape adhered to its active surface 32 is held in a stage (not shown) and a reverse surface 34, opposite to the surface where the tape is adhering, is lapped with a grinder or lap 37 so that the wafer has a thickness W2. In FIG. 3C, the ultraviolet sensitive tape 35 is irradiated with ultraviolet rays 36 to weaken its adhesiveness, thereby releasing it from the wafer 30.

The ultraviolet sensitive tape 35 is usually made from photo-polymerizable prepolymers, photo-polymerizable monomers, tackifying agents, cross-linking agents, photo-initiators and photo-sensitive agents. When the ultraviolet sensitive tape (35) is irradiated with ultraviolet rays 36 as shown in FIG. 3C, the photo-initiator is activated and a photo-setting occurs rapidly. The tape has an adhesiveness above about 100 g/25 mm before being irradiated with UV rays, and an adhesiveness below about 30 g/25 mm after being irradiated since the photo-setting reaction forms a solid polymer matrix. An adhesiveness below 30 g/25 mm is considered negligible, and the tape 35 is easily released from the wafer 30.

Figure 4:
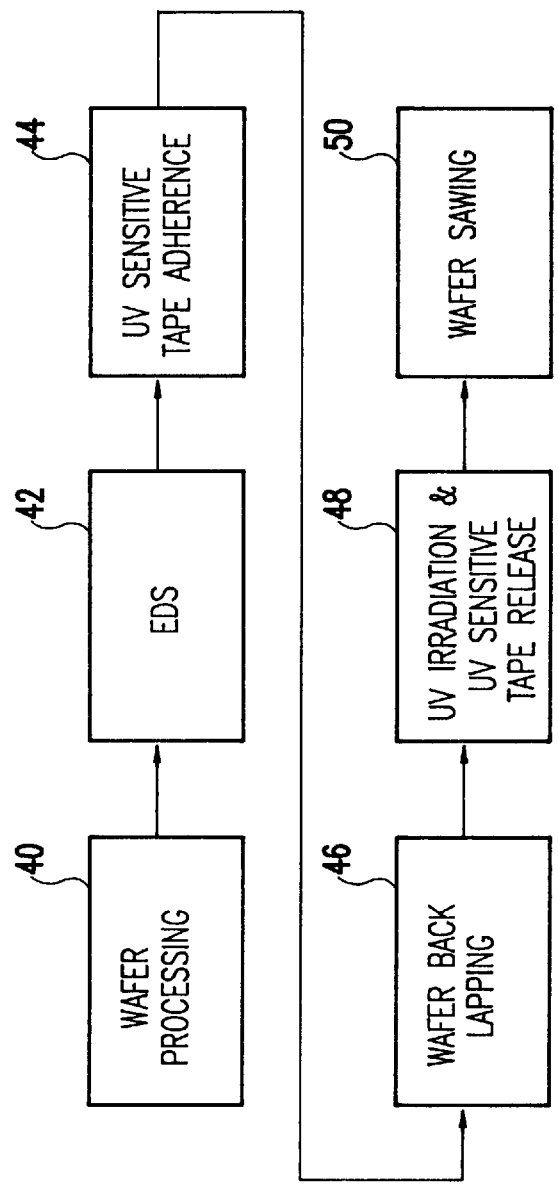
FIG. 4 is a flow chart showing a process for producing semiconductor devices according to the present invention.

FIG. 4 is a flow chart showing the process for producing semiconductor devices according to the present invention. The wafer back lapping process according to the present invention starts with the wafer processing step 40 in which desired patterns are formed on a surface of a wafer. In step 42 the wafer is subjected to an EDS test to identify the good and bad chips. In step 44 an ultraviolet sensitive tape is adhered to the active surface of the wafer. Step 46 is the wafer back lapping step. In step 48 the wafer is irradiated with UV rays, causing the ultraviolet sensitive tape to be released from the wafer. In step 50 the wafer is scribed and divided or sawed into dice. The wafer sawing step may be performed prior to or after the tape is released from the wafer. After the above processes, the wafer is delivered for subsequent manufacturing steps, for example, a die-bonding process for package assembly.

As explained above, according to the present invention, the process comprises the adhesion of an ultraviolet sensitive tape to a surface of the wafer where predetermined circuit patterns are formed, instead of the application of a photoresist or protective vinyl tape to the wafer, and then subjecting the wafer to a wafer back lapping process. Since, the ultraviolet sensitive tape can be easily released upon irradiation by UV rays, the problems associated with the applications of the photoresist and protective vinyl tape on the wafer (e.g., the use of chemical compounds for removing them from the wafer) can be avoided.

Figure 1A:
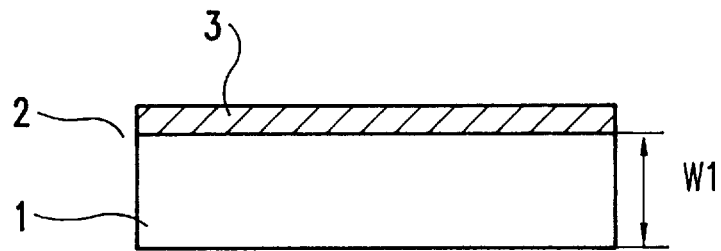
FIGS. 1A through 1E are schematic illustrations of successive steps of a conventional process for lapping the back (bottom surface) of a wafer.
Figure 1B:
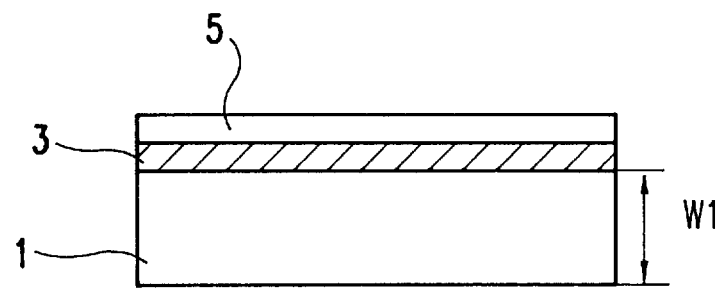
Figure 1C:
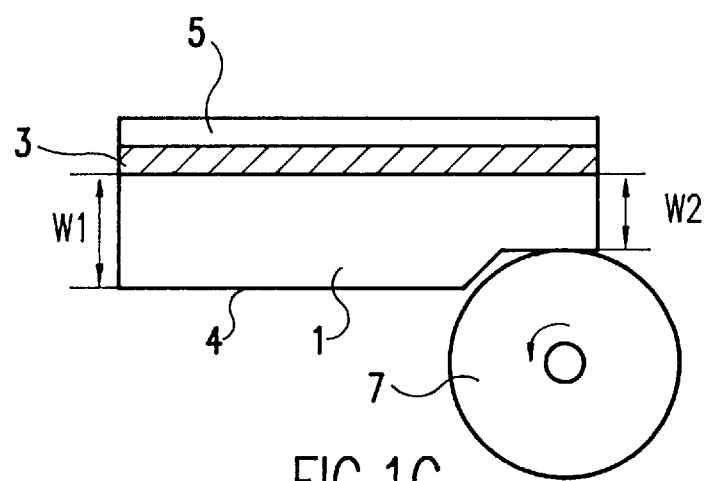
Figure 1D:
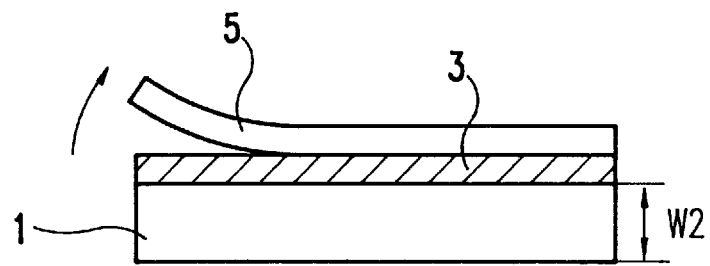
Figure 1E:
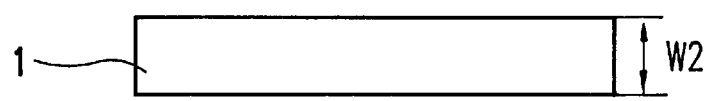
Figure 2:
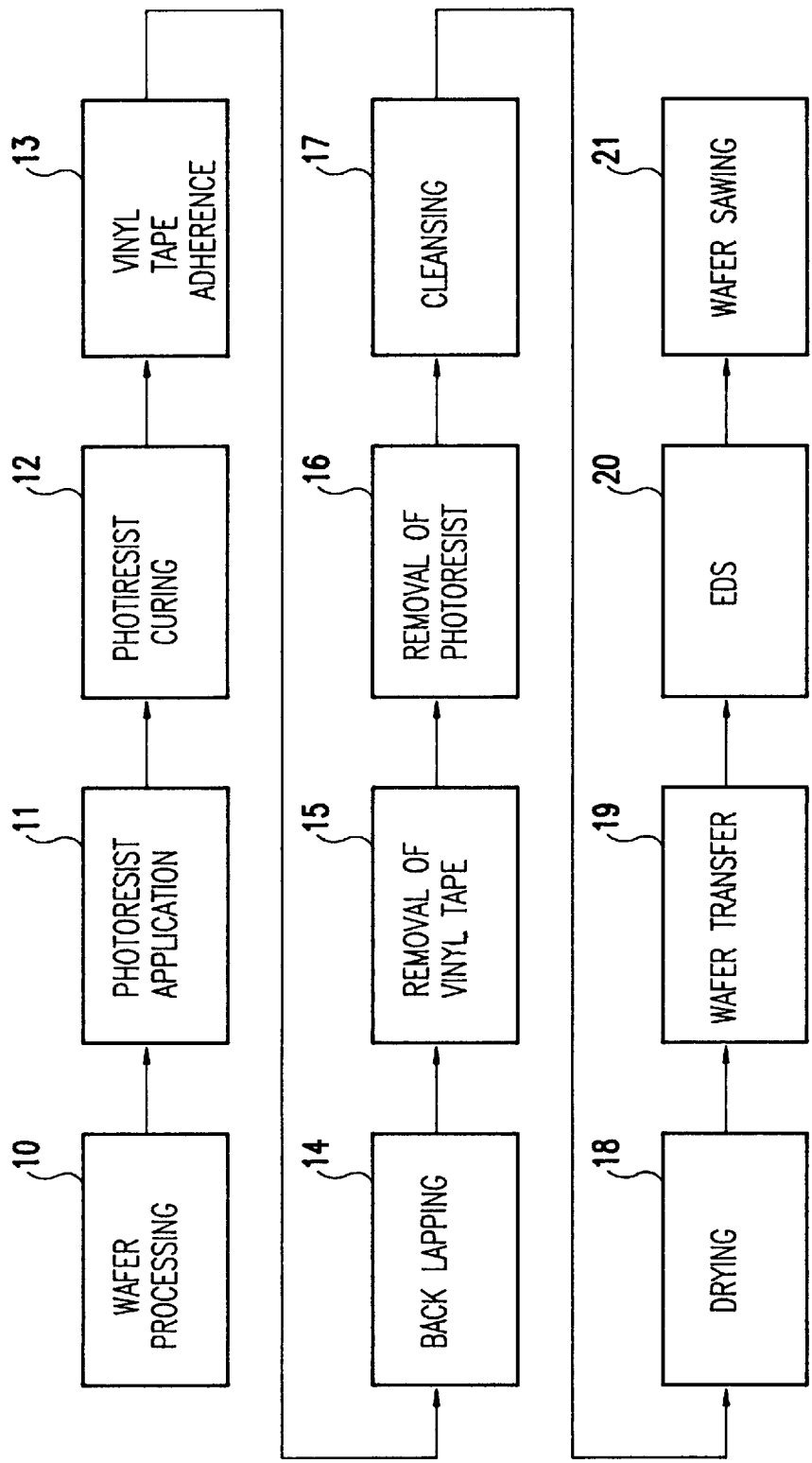
FIG. 2 is a flow chart showing a conventional process for producing semiconductor devices.

Moreover, the process according to the present invention, carried out in the three steps of adherence of an ultraviolet sensitive tape, back lapping, and release of the tape upon irradiation of ultraviolet rays, results in a shortened production time compared with the conventional process described with reference to FIG. 2, which comprised more than six steps. Further, since the photoresist film is not coated onto the wafer, the EDS test of the wafer can be performed prior to the back lapping process so that breakage or contamination of the wafer can be effectively prevented. Moreover, without the photoresist application requirement, the back lapping process and the wafer sawing or scribing process can be performed along the same production line.

Although preferred embodiments of the present invention have been described in detail hereinabove, it should be clearly understood that many variations and/or modifications of the basic inventive concepts herein taught, which may appear to those of ordinary skill in the art, will still fall within the spirit and scope of the present invention as defined in the appended claims.

What is claimed is:

1. A process for producing semiconductor devices, the process comprising the steps of:

forming a plurality of chips having predetermined circuit patterns on a first surface of a semiconductor wafer;

adhering an ultraviolet sensitive tape to said first surface having predetermined circuit patterns formed thereon;

lapping a second surface of the wafer, opposite to said first surface; and irradiating said ultraviolet sensitive tape with ultraviolet rays to release said ultraviolet sensitive tape from said first surface.

2. The process of claim 1, further comprising the step of identifying chips having acceptable electrical characteristics and identifying chips having unacceptable electrical characteristics, after said forming step.

3. The process of claim 2, wherein said identifying step is carried out by performing a reliability test on said wafer.

4. The process of claim 1, further comprising the step of scribing and dividing the wafer into dice after said irradiating step.

5. The process of claim 1, further comprising the step of scribing and dividing the wafer into dice before said irradiating step.

6. The process of claim 1, wherein said adhering step is performed using an ultraviolet sensitive tape composed of photo-polymerizable prepolymers, photo-polymerizable monomers, tackifying agents, cross-linking agents, photo-initiators and photo-sensitive agents.

* * * * *